United States Patent
Kotani et al.

(10) Patent No.: US 6,249,900 B1
(45) Date of Patent: Jun. 19, 2001

(54) METHOD OF DESIGNING AN LSI PATTERN TO BE FORMED ON A SPECIMEN WITH A BENT PORTION

(75) Inventors: Toshiya Kotani, Sagamihara; Shoji Mimotogi; Soichi Inoue, both of Yokohama; Kazuko Yamamoto, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/176,109

(22) Filed: Oct. 21, 1998

(30) Foreign Application Priority Data

Oct. 22, 1997 (JP) .................................................. 9-289767

(51) Int. Cl.[7] .................................................. G06F 17/50
(52) U.S. Cl. .................................................. 716/5
(58) Field of Search .................................................. 716/5

(56) References Cited

U.S. PATENT DOCUMENTS 5,490,095 * 2/1996 Shimada .................................. 716/5

FOREIGN PATENT DOCUMENTS 4-161956 6/1992 (JP) .
8-321450 12/1996 (JP) .

* cited by examiner

*Primary Examiner*—Matthew Smith
*Assistant Examiner*—Thuan Do
(74) *Attorney, Agent, or Firm*—Finnegan, Henderson, Farabow, Garrett & Dunner, L.L.P.

(57) ABSTRACT

In a method of designing an LSI pattern, before pattern designing, the length B and line width W of a rectangle obtained by dividing a bent design pattern are used as parameters. A line width C at which a desired line width W is obtained for the length B of the rectangle is determined to be a correction value. Each correction value is listed in a table. In designing a pattern, the upper limit Bmax of the length of a line segment is first determined. Of the line segments of the bent design pattern, a shorter one than the upper limit Bmax is extracted. Then, a rectangle including the extracted line segment is extracted. Thereafter, the line width W of the extracted rectangle is corrected to the line width C by reference to the table.

20 Claims, 7 Drawing Sheets

METHOD OF DESIGNING AN LSI PATTERN TO BE FORMED ON A SPECIMEN WITH A BENT PORTION

BACKGROUND OF THE INVENTION

This invention relates to a method of designing an LSI pattern formed on a specimen, such as a mask or a wafer, and more particularly to a pattern design method for making corrections in a design pattern with bent portions frequently used on an element region.

In recent years, semiconductor manufacturing technology has made a remarkable progress and LSIs whose minimum feature size is 0.35 $\mu$m have been mass-produced. Such a miniaturization of LSIs has been realized as a result of a rapid progress in submicroscopic pattern forming techniques known as photolithography.

In photolithography, an exposure mask is first formed on the basis of a design pattern of an LSI. Then, with a projection exposure device, the pattern formed at the mask is projected onto the resist on a wafer, forming a resist pattern. Using the resist pattern as a mask, the underlying layer is etched, forming an LSI pattern on the wafer.

In the times when the pattern size was sufficiently larger than the limit resolution of an exposure device, the plane shape of an LSI pattern to be formed on a wafer was used as a design pattern. As patterns have been miniaturized, the pattern formed on a wafer has differed from the design pattern in a mask formed to the LSI design due to the influence of diffracted light at the exposure device. The difference between the patterns has begun to exhibit adverse effects obviously.

For example, there are many bent patterns in the gate patterns on an element region. When such bent patterns are transferred from the mask onto a wafer, the patterns are blurred due to optical proximity effects. As a result, the finished line widths at the positions corresponding to the bent portions are greater than the design dimensions. That is, the finished line widths at the position corresponding to the bent portions are larger than the desired dimensions. This causes variations in the operating speed of the elements, the threshold voltage, and the dynamic characteristics, including the source-drain current value. When a contact hole is next to bent patterns, the contact hole can come into contact with the gate, resulting in an insulation failure.

To eliminate such problems, a method has been proposed which adds very small auxiliary patterns to, for example, the corners of a design pattern to form a mask plan differing from a conventional design pattern and which forms a mask according to the mask design, as disclosed in Jpn. Pat. Appln. KOKAI Publication No. 6-242595 or Jpn. Pat. Appln. KOKOKU No. 62-7353.

Methods of this type, however, have the following problem: when very small auxiliary patterns are added to the corners of a bent pattern, the volume of data about the mask design becomes tremendous. The design data is converted into drawing data for exposure mask formation and is expressed as an aggregate of various figures. Therefore, when the volume of data has become tremendous as a result of an increase in the number of figures caused by the addition of auxiliary patterns, the computer takes a longer time to perform. processing, leading to an increase in the time required to draw a mask.

Furthermore, it is very difficult to control the size of an auxiliary pattern accurately. The reason is as follows. Because an electron beam or laser light used in mask drawing is a round beam, the corners of the auxiliary pattern are rounded. Therefore, when the dimensions of the auxiliary pattern are as small as about several tens of nanometers, the roundness of the corners has a great effect on the shape of the transferred pattern. As a result, the dimensions of the auxiliary pattern in the design data differ from the dimensions of the transferred auxiliary pattern. This makes it difficult to obtain the effect of correction as expected.

Moreover, in logic products, since the gate layers have various patterns ranging from isolated patterns to dense patterns, it is necessary to consider the effect the diffracted light from those patterns has on the bent patterns. It is very difficult to determine the size of an auxiliary pattern according to each pattern. The determination also needs a lot of labor.

As described above, in the prior art, when very small auxiliary patterns were added to the corners of a design pattern to form a bent pattern accurately, the volume of data about the mask design was increased. As a result, the computer needed a very long time to perform processing. In addition, it took a longer time to draw a mask. Furthermore, it was very difficult to control the size of an auxiliary pattern accurately.

BRIEF SUMMARY OF THE INVENTION

It is, accordingly, an object of the present invention to overcome the problems in the prior art by providing a pattern design method capable of not only forming a transferred pattern faithfully to a design pattern without providing auxiliary patterns but also improving the accuracy of the dimensions of a finished pattern without increasing the volume of data.

The foregoing object is accomplished by providing a pattern design method comprising: the step of dividing a design pattern a part of which is a bent portion in the bent portion, using a length B and a line width W of a unit figure obtained by the division as parameters, determining a line width C at which a desired line width W is obtained in a finished pattern for the length B of the unit figure to be a correction value, and listing these relationships in a table; the step of determining the upper limit Bmax of the length of a line segment to be corrected for the design pattern having the bent portion; the step of extracting a shorter one than the upper limit Bmax of the line segments of the design pattern having the bent portion; the step of extracting a unit figure including the extracted line segment; and the step of correcting the line width W of the extracted unit figure to the line width C by reference to the table.

With the present invention, because only the line width of the bent portion of a pattern is corrected, there is no need of increasing the number of figures in the design data. This prevents a burden on computer processing from increasing. Moreover, because very small correction patterns are not added, there is no need of taking into consideration the effect of the roundness of the corners in mask drawing. This enables correction to be made accurately and a pattern with the desired dimensions to be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Before explanation of embodiments of the present invention, the basic principle of the present invention will be described.

Figure 1:
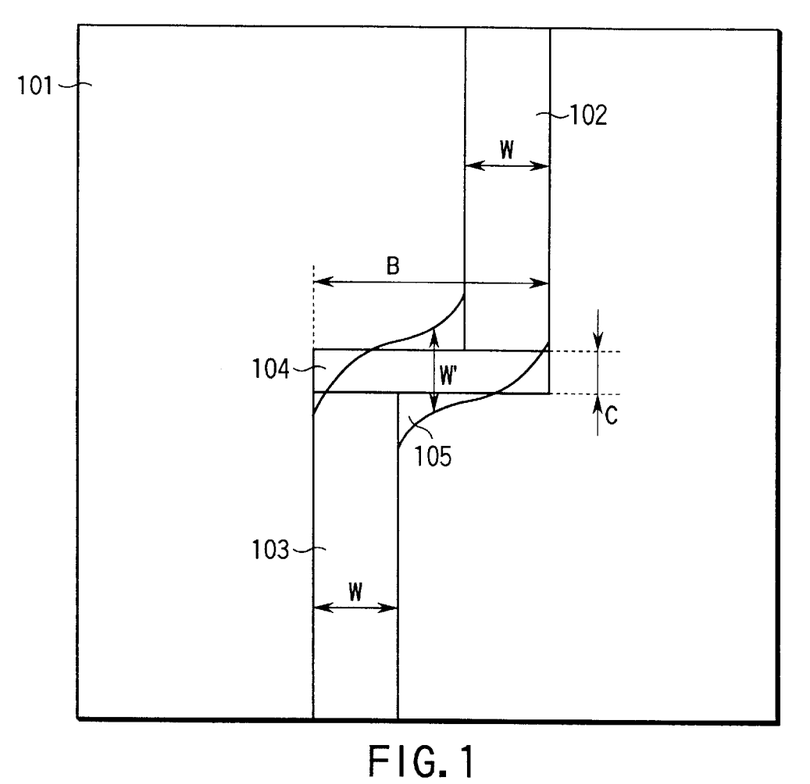
FIG. 1 is a plan view of a mask including a bent pattern corrected in the present invention.

FIG. 1 is a plan view of a mask pattern obtained by extracting a line segment whose length is within a specific region of a design pattern (a bent pattern) with a bent portion and correcting a rectangle including the line segment according to a specific amount of correction. A mask 101 shown in FIG. 1 is composed of rectangles 102, 103 with a desired dimension of W and a rectangle 104 with a line width of C and a length of B. The line width C of the rectangle 104 is determined by doing calculations or experiments so that the finished dimension W' of a transferred pattern 105 in the rectangle 104 of FIG. 1 may equal a desired dimension W. Because the line width C depends on the length B, the desired dimension W, the exposure condition, and the processing condition, the relationship between the line width C and the length B is also determined under suitable exposure conditions and processing conditions.

On the basis of the relationship between the line width C and length B determined by the above-described method, correction is made using the design data. When the bent pattern is at a gate layer, use of an automatic correction program constructed according to an algorithm made up of the following items (1) to (4) enables simpler, faster correction:

(1) Extract line segments whose length is within a specific range of the design data.

(2) Extract only those on an element region of the line segments extracted in item (1).

(3) Extract a rectangle including the line segments extracted in item (2).

(4) Correct the line width of the short side of the rectangle extracted in item (3) on the basis of the relationship between the line width C and length B.

Because the method has no need to increase the number of figures in the design data, the burden on the data conversion process and the mask drawing time will not increase. Moreover, because very small patterns are not added, there is no need of taking into account the effect of the roundness of the corners in mask drawing, which enables accurate correction.

Hereinafter, the details of the present invention will be explained using embodiments shown in the accompanying drawings.

FIRST EMBODIMENT

Figure 2:
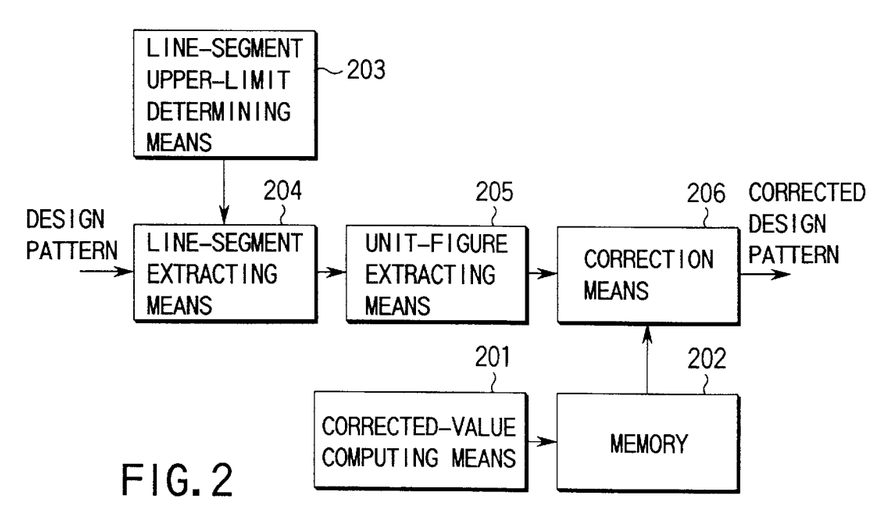
FIG. 2 is a block diagram of a design pattern correction unit according to a first embodiment of the present invention.
Figure 3:
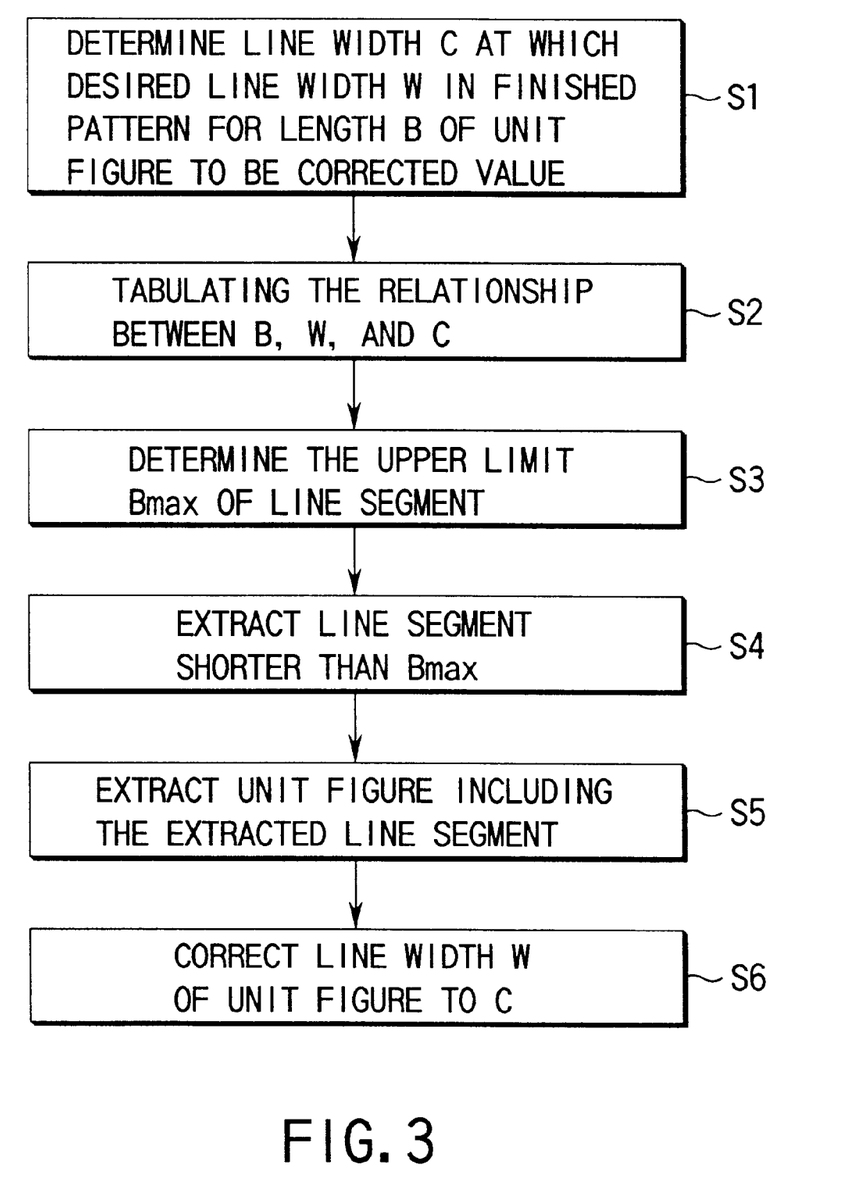
FIG. 3 is a flowchart to help explain a method of correcting a design pattern according to the first embodiment of the invention.

FIG. 2 is a block diagram of a design pattern correction unit according to a first embodiment of the present invention. FIG. 3 is a flowchart to help explain a design pattern correction method according to the first embodiment. The unit is realized by a computer which reads a program recorded on a recording medium, such as a magnetic disk, and whose operation is controlled by the program.

In corrected-value computing means 201, a design pattern a part of which is a bent portion is divided in the bent portion. The length B and line width W of a unit figure obtained by the division are used as parameters. A line width of C at which a desired line width of W is obtained in a finished pattern for the length B of the unit figure is determined to be a corrected value (step S1). As a result of the calculation, the relationship between B, W, and C is listed in a table, which is then stored in a memory 202 (step S2).

In line-segment upper-limit determining means 203, the upper limit Bmax of the length of a line segment to be corrected is determined for the design pattern including a bent portion (step S3). In line-segment extracting means 204, of the line segments of the design pattern including a bent portion, one shorter than the upper limit Bmax is extracted (step S4). In unit-figure extracting means 205, a unit figure including the extracted line segment is extracted (step S5). In correction means 206, the line width W of the extracted unit figure is corrected to the line width C, referring to the table stored in the memory 202 (step S6).

A concrete example of a design pattern correction method according to the embodiment will be explained.

The desired dimension W was determined to be W=0.18 μm and KrF (γ=248 nm) was used as a light source. By a normal illumination with numerical aperture (NA)=0.6 and degree of partial coherence (σ)=0.75, the pattern of a mask was projected onto a wafer. The line width C was narrowed down from the desired dimension W=0.18 μm in units of 0.01 μm. Each time the line width was narrowed down, the deviation of the transferred pattern dimension W' from the desired dimension W, that is, ΔW=W−W', was computed. Each time the length B was changed, similar calculations were done.

In measuring the transferred pattern dimension W', the mask pattern is actually projected on the wafer. Thereafter, the wafer is subjected to a developing process to form a resist pattern. The resist pattern is then observed by SEM (Scanning Electron Microscope). In this case, a large number of patterns are formed on the mask, narrowing them down from the desired dimension W=0.18 μm in units of 0.01 μm. Instead of the actual exposure and development processes, the transferred pattern dimension W' may be found by simulation.

Figure 4:
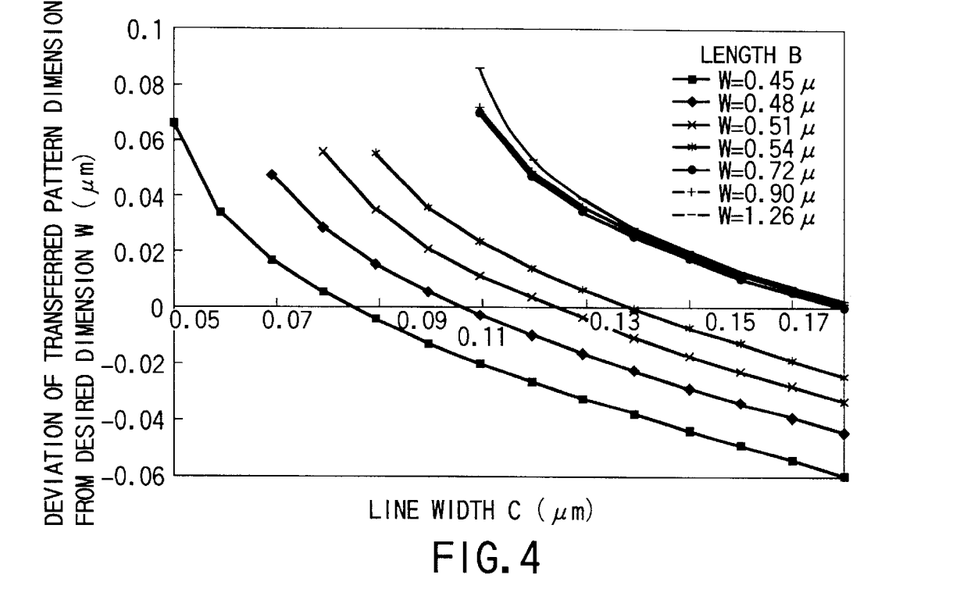
FIG. 4 shows the relationship between the line width C at a desired dimension W and the deviation of a transferred pattern dimension W' from a desired dimension W.
Figure 5:
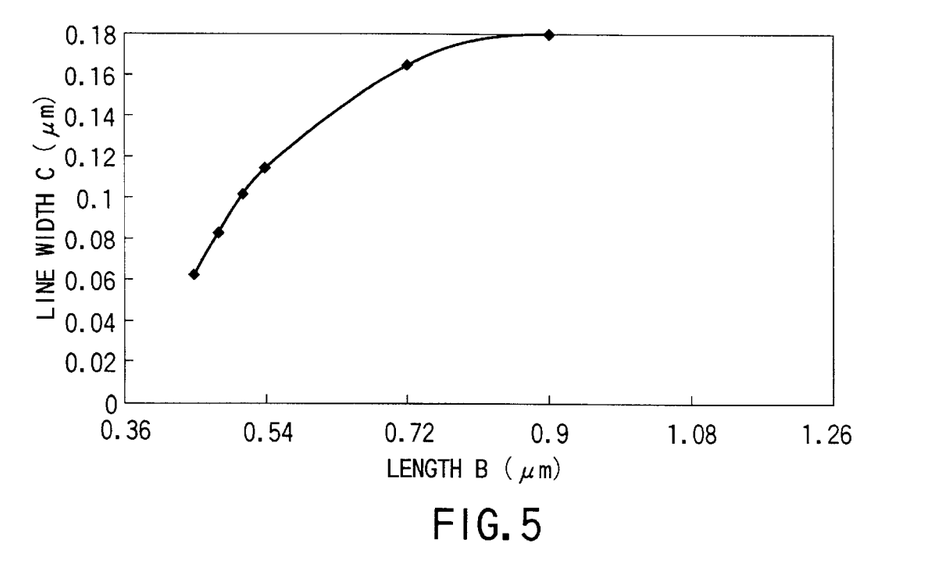
FIG. 5 shows the relationship between the line width C and length B at which the deviation of the transferred pattern dimension W' from the desired dimension W is zero.

FIG. 4 shows the relationship between the line width C and the deviation ΔW of the transferred pattern dimension W' from the desired dimension W when the length B is changed. FIG. 5 shows the result of selecting the line width C and length B at which the deviation ΔW of the transferred pattern dimension W' from the desired dimension W is zero in FIG. 4 and making interpolation. On the basis of the relationship of FIG. 5, correction was made in the design data.

Figure 6A:
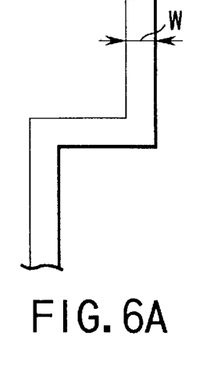
FIGS. 6A to 6C are plan views of a design of a bent pattern, a mask design, and a finished pattern in the present invention, respectively.
Figure 6B:
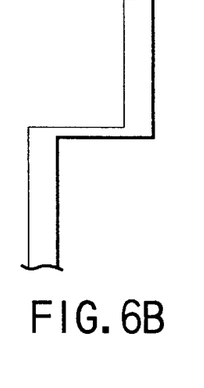
Figures 6C, 7:
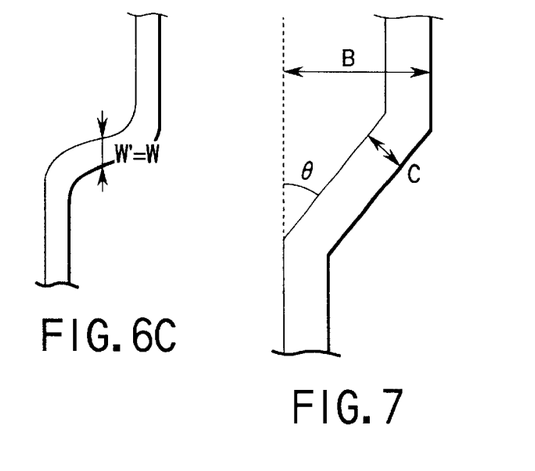
FIG. 7 is a plan view of a bent pattern where an angle of θ a bent portion forms is not 90°.

A mask was formed on the basis of the mask design using the design data corrected by the method. The pattern formed on a wafer using the mask was observed. FIG. 6A shows a desired design in the embodiment; FIG. 6B shows a mask design; and FIG. 6C is a plan view of the finished pattern. As shown in FIG. 6C, the line width of the finished pattern in the position corresponding to the bent portion was finished to the desired dimension of W=0.18 μgm. The embodiment proved itself to be effective in correcting the line width at the bent portion in the bent pattern.

As shown in FIG. 7, when the angle θ the bent portion forms is not 90°, the sine component B of the line segment length of a bent pattern and the corrected dimensions of the line width C determined by the angle θ of the bent portion are listed in a table. An example of the table is shown below as Table 1.

[TABLE 1]

| LINE SEGMENT LENGTH B (SIN COMPONENT) | ANGLE θ OF BENT PORTION | LINE WIDTH C |
| --- | --- | --- |
| 0.45 | 90 | 0.064 |
|  | 75 | 0.066 |
|  | 60 | 0.073 |
|  | 45 | 0.090 |
|  | 30 | 0.127 |
|  | 15 | 0.180 |
| 0.48 | 90 | 0.083 |
|  | 75 | 0.086 |
|  | 60 | 0.096 |
|  | 45 | 0.118 |
|  | 30 | 0.166 |
|  | 15 | 0.180 |
| 0.51 | 90 | 0.102 |
|  | 75 | 0.105 |
|  | 60 | 0.117 |
|  | 45 | 0.144 |
|  | 30 | 0.180 |
|  | 15 | 0.180 |
| 0.54 | 90 | 0.115 |
|  | 75 | 0.119 |
|  | 60 | 0.133 |
|  | 45 | 0.163 |
|  | 30 | 0.180 |
|  | 15 | 0.180 |
| 0.72 | 90 | 0.166 |
|  | 75 | 0.172 |
|  | 60 | 0.180 |
|  | 45 | 0.180 |
|  | 30 | 0.180 |
|  | 15 | 0.180 |
| 0.90 | 90 | 0.180 |
|  | 75 | 0.180 |
|  | 60 | 0.180 |
|  | 45 | 0.180 |
|  | 30 | 0.180 |
|  | 15 | 0.180 |
| 1.26 | 90 | 0.180 |
|  | 75 | 0.180 |
|  | 60 | 0.180 |
|  | 45 | 0.180 |
|  | 30 | 0.180 |
|  | 15 | 0.180 |

As described above, when the line width B of a bent pattern and the amount of correction in the line width C corresponding to the angle θ the bent portion forms are listed in a table, this makes it possible to finish the finished line width of every bent pattern to the desired dimension easily. The method is effective not only for a bent pattern on an element region at a gate layer but also for a wiring layer used in a cell section or a core section of a memory. With the method, the problem of breaks in the bent portion can be avoided easily.

Figure 8:
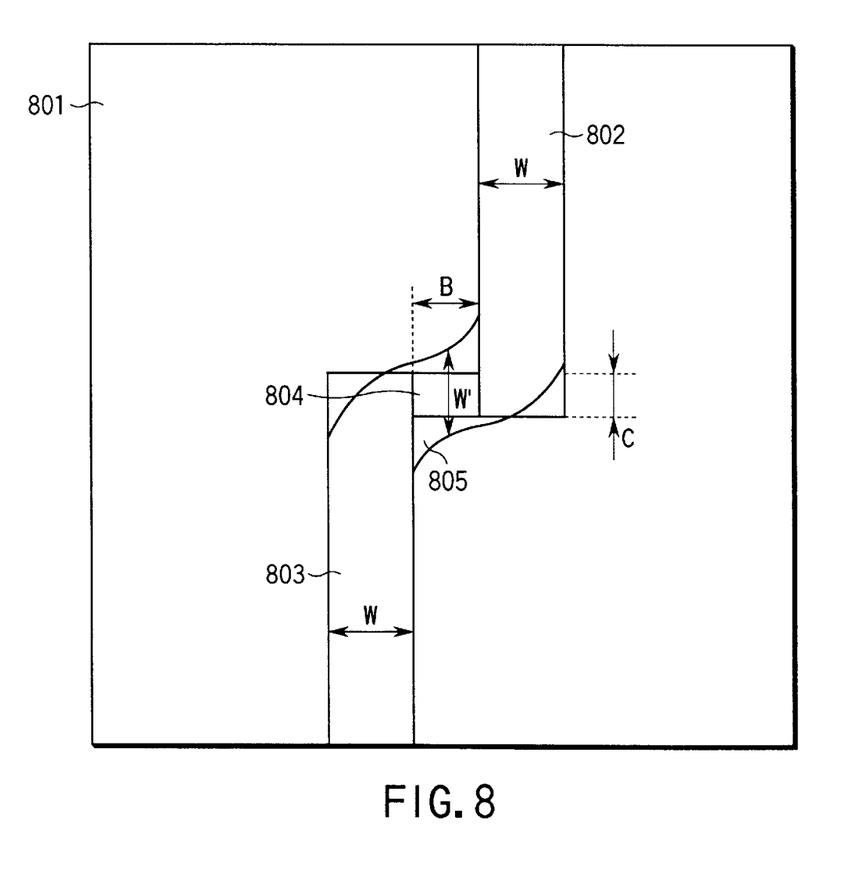
FIG. 8 is a plan view of another bent pattern differing from the way of design shown in FIG. 1.
Figure 9:
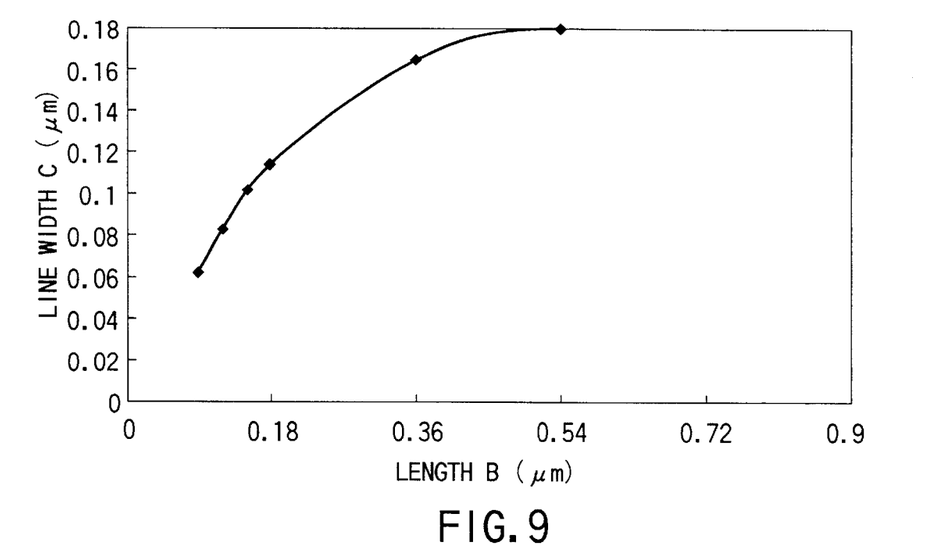
FIG. 9 shows the result of making interpolation.

While in the embodiment, the bent pattern is divided longitudinally, the division method is not limited to this and the bent pattern may be divided laterally. In this case, a plan view of a mask pattern is as shown in FIG. 8. In FIG. 8, numerals 801 to 805 correspond to numerals 101 to 105 in FIG. 1. Because the length B of a rectangle 804 is shorter than that in FIG. 1 by 2W, the result of selecting the line width C and length B at which the deviation ΔW of the transferred pattern dimension W' from the desired dimension W is zero in FIG. 8 and making interpolation is as shown in FIG. 9.

Figure 10:
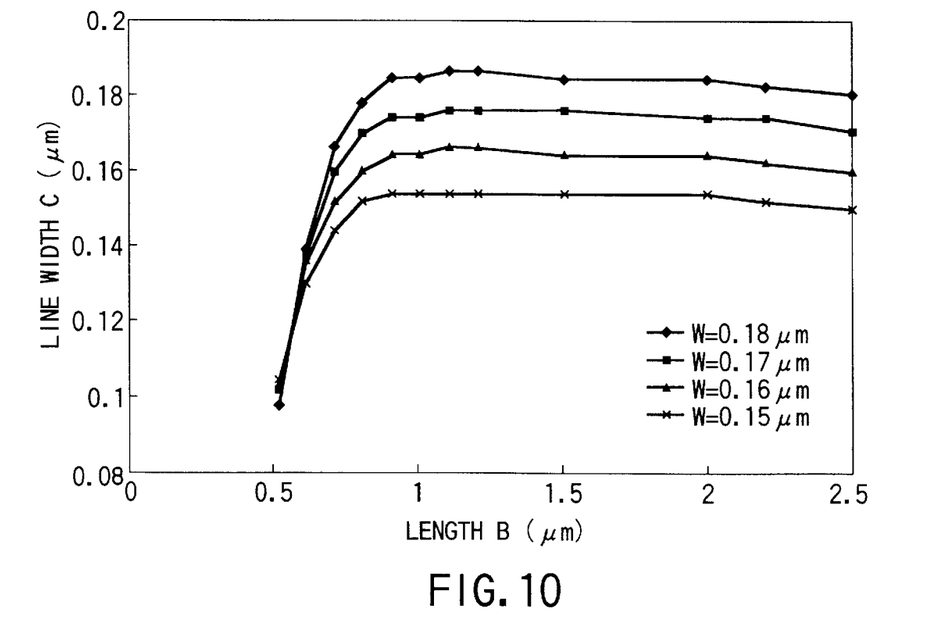
FIG. 10 shows the result of calculating the relationship between the main pattern dimension W, the length of the bent portion B, and the line width C.

FIG. 10 shows the result of calculating the relationship between the main pattern dimension W, the length B of the bent portion, and the line width C. This is the result of doing calculations to find the equivalent for that of FIG. 5, while changing W. From FIG. 10, it can be seen that when the length $B \leq 1.0$ μm, the following expression should be met: the line width C< the main pattern line width W.

SECOND EMBODIMENT

A second embodiment of the present invention relates to a method of making correction easily and quickly by use of an automatic correction program when there are bent patterns at a gate layer.

Figure 11:
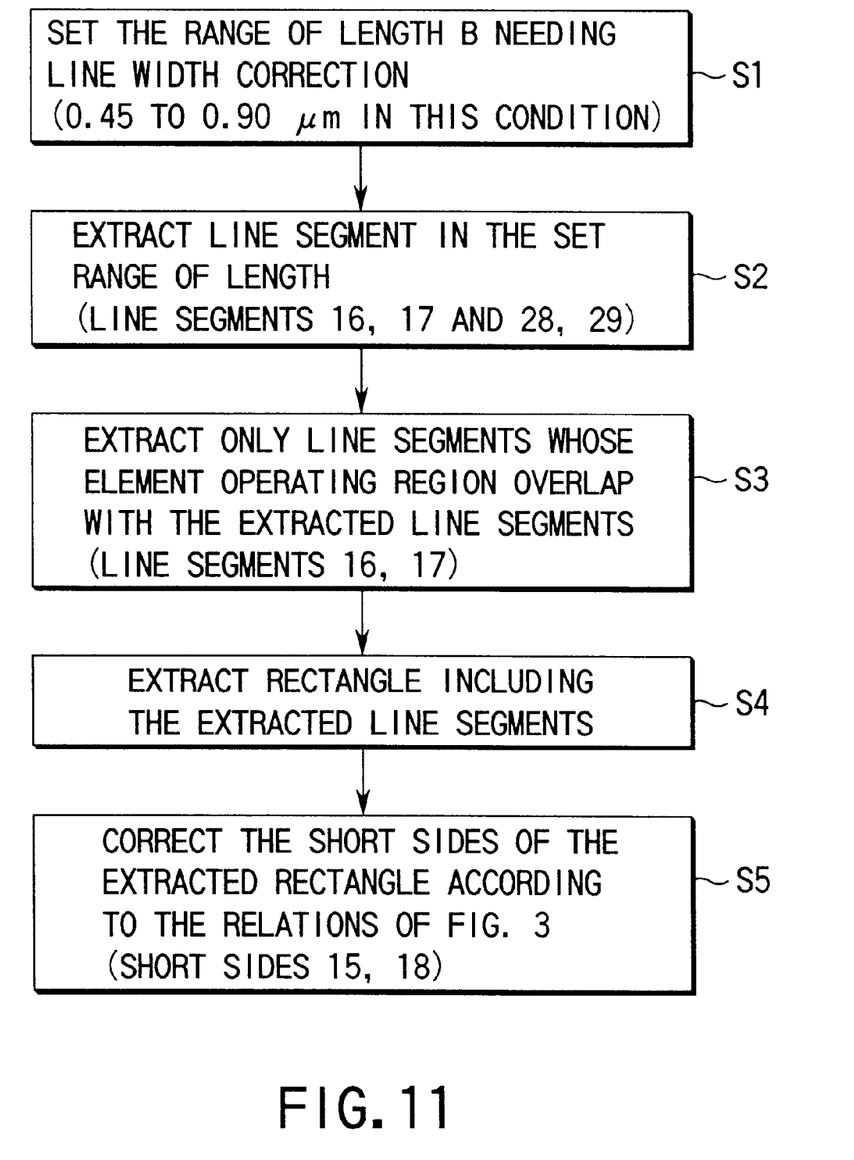
FIG. 11 shows an algorithm of an automatic correction program using the desired dimension W.

FIG. 11 shows an example of an algorithm for an automatic correction program in a case where the desired dimension W is determined to be W=0.18 μm, KrF (γ=248 μm) is used as a light source, and exposure is made using a normal illumination with NA=0.6 and σ=0.75. FIGS. 12A to 12D are plan views of a mask of an element operating region laid on top of a mask of a bent pattern at a gate layer. In FIGS. 12A to 12D, numerals 11 to 34 indicate line segments, 35 a rectangle, and 40 an element operating region. The line segments 11 to 34 each correspond to the respective sides of the rectangles. The line segment 12 corresponds to the right side of a lengthwise rectangle, the line segment 15 to the right side of a breadthwise rectangle, the line segment 14 to the bottom side of the lengthwise rectangle, the line segment 16 to the top side of the breadthwise rectangle, the line segment 17 to the bottom side of the breadthwise rectangle, the line segment 19 to the top side of the lengthwise rectangle, the line segment 18 to the left side of the breadthwise rectangle, and the line segment 21 to the left side of the lengthwise rectangle.

Figure 12A:
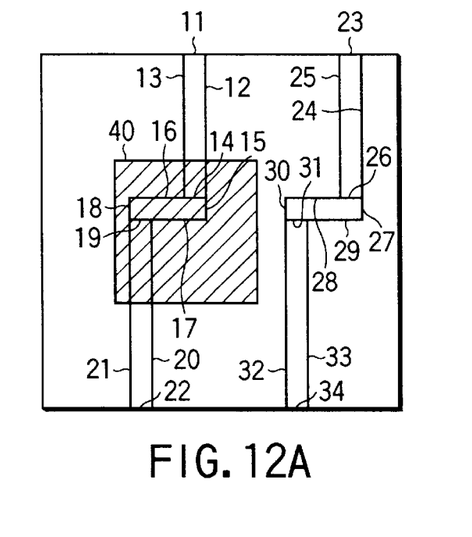
FIGS. 12A to 12D are plan views showing the state where the mask of an element operating region is laid on the mask of a bent pattern at a gate layer.

The procedure for a line width correction method using an automatic correction program will be described by reference to FIG. 11 and FIGS. 12A to 12D. From the predetermined relationship between the line segment C and the length B shown in FIG. 5, it will be understood that when B=0.45 to 0.90 μm, the line width of the bent pattern has to be corrected and that when B=0.90 μm or more, the line width need not be corrected. The range of the length B whose line width needs to be corrected is first set (step S1). Then, as shown in FIG. 12A, the line segments 16, 17, and 28, 29 in the range of length B from 0.45 to 0.90 μm are extracted (step S2).

Figure 12B:
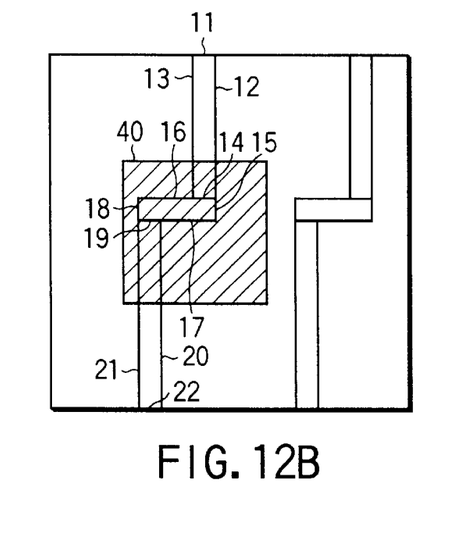
Figure 12C:
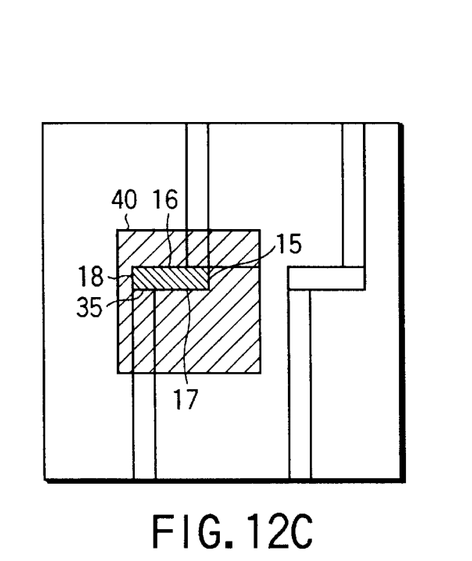
Figure 12D:
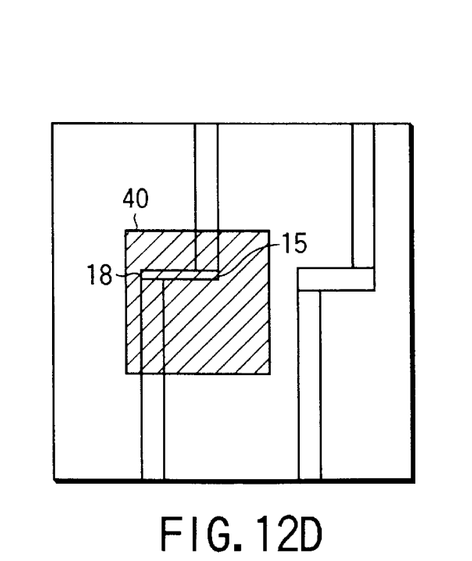

Next, as shown in FIG. 12B, of the extracted line segments, only the ones existing on the element operating region 40 are extracted (step S3). Then, as shown in FIG. 12C, the rectangle 35 including the line segments 16, 17 is extracted (step S4). Furthermore, as shown in FIG. 12D, the length of the short sides 15, 18 of the extracted rectangle 35 is corrected on the basis of the relationship of FIG. 5 (step S5). At that time, the length B of the line segments 16, 17 is divided into an n number of equal parts in the range from 0.45 to 0.90 μgm. Then, B is expressed as:

$Bm=0.45+(0.45n) \times m$ (where m is an integer in the range from 1 to n).

Then, Bm is calculated each time the value of m is incremented by one. When the expression Bm≧B is met, it is assumed that Bm=B. Next, Cm corresponding to the Bm is determined from FIG. 5. The line width of the short sides 15, 18 of the rectangle 35 is corrected to Cm.

A mask was formed on the basis of the mask design using the design data on the bent portion of the bent pattern on the element region corrected by the method. The pattern formed on a wafer using the mask was observed. The result showed that the transferred pattern dimensions at all the bent portions of the bent patterns on the element region had been finished to the desired dimension W=0.18 µm. This proved that the automatic correction program of the second embodiment was very effective.

The present invention is not limited to the embodiments. While in the embodiments, a pattern bent twice at a right angle, that is, a cranked pattern, has been used, a once-bent pattern may be used. In this case, the once-bent pattern is less thick than the twice-bent pattern and a correction table as shown in FIG. 5 cannot be used. Therefore, a table for the once-bent pattern only should be prepared. The present invention is not restricted to a pattern bent at a right angle and may be applied to a pattern bent at 45 degrees or at other angles.

While in the embodiments, explanation of mask patterns obtained by forming design patterns on a mask has been given, the present invention may be applied to a design pattern used in an electron beam drawing machine.

Not being used alone as a correction method or a correction unit, the present invention may be incorporated into a data conversion unit (or a CAD unit with an MDP process) or a proximity effect correcting section in an EB mask drawing machine.

Furthermore, the techniques described in the embodiments may be written onto a recording medium, such as a magnetic disk (e.g., a floppy disk or a hard disk), an optical disk (e.g., a CD-ROM, a CD-RAM, or a DVD), or a semiconductor memory in the form of programs executable on a computer and be used on various devices or transferred via communication mediums for use with various devices. A computer that realizes an apparatus of the invention reads the program recorded on a recording medium and executes the aforementioned processes under the control of the program.

The present invention may be practiced or embodied in still other ways without departing from the spirit or essential character thereof.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern design method comprising:
   the step of dividing a design pattern a part of which is a bent portion in the bent portion, using a length B and a line width W of a unit figure obtained by the division as parameters, determining a line width C at which a desired line width W is obtained in a finished pattern for the length B of said unit figure to be a correction value, and tabulating these relationships;
   the step of determining an upper limit Bmax of the length of a line segment to be corrected according to said tabulated relationship of the parameters for said design pattern having the bent portion;
   the step of extracting a shorter one than said upper limit Bmax of the line segments of said design pattern having the bent portion;
   the step of extracting a unit figure including said extracted line segment; and
   the step of correcting the line width W of said extracted unit figure to the line width C by reference to said tabulated relationships.

2. A pattern design method according to claim 1, wherein said tabulating step includes the steps of
   changing the length B of a unit figure obtained by dividing said design pattern having the bent portion, finding the line width W' of a finished pattern actually produced when a pattern is designed at the line width W for each length B, finding from, each deviation of W−W'=ΔW, a line width C=W+ΔW (where m is a constant in the range from 0.2 to 1.0 determined by the exposure wavelength γ, the numerical aperture NA of a projection optical system, the line width W, and the pattern pitch) at which a desired line width W is obtained for the length B of said unit figure, and listing the line width C as a correction value in a table.

3. A pattern design method according to claim 2, wherein said tabulating step includes the steps of, when the angle θ said bent portion forms fulfills the expression 0°<θ≦90°, tabulating the sine component B of the length of the line segment of said bent portion and the corrected dimension of the line width C determined by the angle θ of said bent portion.

4. A pattern design method according to claim 1, wherein said unit figure is a rectangle and a pattern is designed, provided that the long side of the rectangle has a length of B and its short side has a line width of W.

5. A pattern design method according to claim 1, wherein said design pattern is a mask pattern to be formed on a photomask.

6. A pattern design method according to claim 1, wherein said design pattern having the bent portion is bent at a right angle.

7. A pattern design method according to claim 1, further comprising the step of performing said tabulating process while changing the exposure condition and the processing condition, and preparing a correction table by the tabulation for each exposure condition and each processing condition.

8. A pattern design method according to claim 1, wherein said design pattern having the bent portion is divided either longitudinally or laterally.

9. A pattern design method comprising:
   the step of dividing a design pattern a part of which is a bent portion in the bent portion, using a length B and a line width W of a unit figure obtained by the division as parameters, determining a line width C at which a desired line width W is obtained in a finished pattern for the length B of said unit figure to be a correction value, and listing these relationships in a table;
   the step of determining an upper limit Bmax of the length of a line segment to be corrected according to said relationships stored in said table for said design pattern having the bent portion;
   the step of extracting a shorter one than said upper limit Bmax and on a region where it is required to have a higher accuracy than a specific accuracy of the line segments of said design pattern having the bent portion;
   the step of extracting a unit figure including said extracted line segment; and
   the step of correcting the line width W of said extracted unit figure to the line width C by reference to said table.

10. A pattern design method according to claim 9, wherein said tabulating step includes the steps of
    changing the length B of a unit figure obtained by dividing said design pattern having the bent portion, finding the line width W' of a finished pattern actually produced when a pattern is designed at the line width W for each length B, using the length B and line width W of said unit figure as parameters with respect to each deviation of W−W'=ΔW, finding a line width C=W+mΔW (where m is a constant in the range from 0.2 to 1.0 determined by the exposure wavelength γ, the numerical aperture NA of a projection optical system, the line width W, and the pattern pitch) at which a desired line width W is obtained for the length B of said unit figure, determining the line width C to be a correction value, and listing each correction value in a table.

11. A pattern design method according to claim 10, wherein said tabulating step includes the steps of, when the angle θ said bent portion forms fulfills the expression 0°<θ≦90°, tabulating the sine component B of the length of the line segment of said bent portion and the corrected dimension of the line width C determined by the angle θ of said bent portion.

12. A pattern design method according to claim 9, wherein said unit figure is a rectangle and a pattern is designed, provided that the long side of the rectangle has a length of B and its short side has a line width of W.

13. A pattern design method according to claim 9, wherein said design pattern is a mask pattern to be formed on a photomask.

14. A pattern design method according to claim 9, wherein said design pattern having the bent portion is bent at a right angle.

15. A pattern design method according to claim 9, further comprising the step of performing said tabulating process while changing the exposure condition and the processing condition, and preparing a correction table by the tabulation for each exposure condition and each processing condition.

16. A pattern design method according to claim 9, wherein said design pattern having the bent portion is divided either longitudinally or laterally.

17. A pattern design method according to claim 9, wherein said region where the line segment is required to have a higher accuracy is an element region, such as a source drain gate layer.

18. A pattern design apparatus comprising:
   means for dividing a design pattern a part of which is a bent portion in the bent portion, using a length B and a line width W of a unit figure obtained by the division as parameters, determining a line width C at which a desired line width W is obtained in a finished pattern for the length B of said unit figure to be a correction value, and listing these relationships in a table;
   means for determining an upper limit Bmax of the length of a line segment to be corrected according to said relationships stored in said table for said design pattern having the bent portion;
   means for extracting a shorter one than said upper limit Bmax of the line segments of said design pattern having the bent portion;
   means for extracting a unit figure including said extracted line segment; and
   means for correcting the line width W of said extracted unit figure to the line width C by reference to said table.

19. A pattern exposure mask, produced by a method comprising the steps of:
   dividing a design pattern a part of which is a bent portion in the bent portion, using a length B and a line width W of a unit figure obtained by the division as parameters, determining a line width C at which a desired line width W is obtained in a finished pattern for the length B of said unit figure to be a correction value, and listing these relationships in a table;
   determining an upper limit Bmax of the length of a line segment to be corrected according to said relationships stored in said table for said design pattern having the bent portion;
   extracting a shorter one than said upper limit Bmax of the line segments of said design pattern having the bent portion;
   extracting a unit figure including said extracted line segment; and
   correcting the line width W of said extracted unit figure to the line width C by reference to said table.

20. A computer-readable recording medium which stores a program for controlling a computer and correcting the dimensions of a bent portion of a design pattern, wherein said program causes the computer to operate;
   means for dividing a design pattern a part of which is a bent portion in the bent portion, using a length B and a line width W of a unit figure obtained by the division as parameters, determining a line width C at which a desired line width W is obtained in a finished pattern for the length B of said unit figure to be a correction value, and listing these relationships in a table;
   means for determining an upper limit Bmax of the length of a line segment to be corrected according to said relationships stored in said table for said design pattern having the bent portion;
   means for extracting a shorter one than said upper limit Bmax of the line segments of said design pattern having the bent portion;
   means for extracting a unit figure including said extracted line segment; and
   means for correcting the line width W of said extracted unit figure to the line width C by reference to said table.

* * * * *

UNITED STATES PATENT AND TRADEMARK OFFICE
CERTIFICATE OF CORRECTION

PATENT NO.    : 6,249,900 B1
DATED         : June 19, 2001
INVENTOR(S)   : Toshiya Kotani et al.

It is certified that error appears in the above-identified patent and that said Letters Patent is hereby corrected as shown below:

<u>Column 8,</u>
Line 13, "$C=W+\Delta W$" should read -- $C=W+m\Delta W$ --.
Line 15, "wavelength $\gamma$" should read -- wavelength $\lambda$ --.

<u>Column 9,</u>
Line 7, "wavelength $\gamma$" should read -- wavelength $\lambda$ --.

Signed and Sealed this

Nineteenth Day of November, 2002

*Attest:*

JAMES E. ROGAN
*Attesting Officer*      *Director of the United States Patent and Trademark Office*